United States Patent
Betawar et al.

(10) Patent No.: US 7,661,053 B2
(45) Date of Patent: Feb. 9, 2010

(54) METHODS AND APPARATUS FOR PATTERNIZING DEVICE RESPONSES

(75) Inventors: Manoj Betawar, Fremont, CA (US); Dinesh Goradia, Fremont, CA (US)

(73) Assignee: Sapphire Infotech, Inc., Fremont, CA (US)

( * ) Notice: Subject to any disclaimer, the term of this patent is extended or adjusted under 35 U.S.C. 154(b) by 0 days.

(21) Appl. No.: 12/338,065

(22) Filed: Dec. 18, 2008

(65) Prior Publication Data

US 2009/0100299 A1  Apr. 16, 2009

Related U.S. Application Data

(63) Continuation of application No. 11/277,614, filed on Mar. 27, 2006, now Pat. No. 7,478,305.

(51) Int. Cl.
*G01R 31/28*  (2006.01)
(52) U.S. Cl. ...................................... 714/742
(58) Field of Classification Search ................ 714/742
See application file for complete search history.

(56) References Cited

U.S. PATENT DOCUMENTS

| | | | | |
|---|---|---|---|---|
| 5,854,889 A | * | 12/1998 | Liese et al. | 714/43 |
| 6,158,031 A | * | 12/2000 | Mack et al. | 714/724 |
| 6,654,911 B1 | * | 11/2003 | Miles | 714/38 |
| 6,892,154 B1 | * | 5/2005 | Lee | 702/108 |
| 7,010,782 B2 | * | 3/2006 | Narayan et al. | 717/124 |
| 7,055,138 B2 | * | 5/2006 | Sutton | 717/125 |
| 7,237,161 B2 | * | 6/2007 | Volz | 714/724 |
| 7,284,177 B2 | * | 10/2007 | Hollander et al. | 714/739 |
| 2002/0162059 A1 | * | 10/2002 | McNeely et al. | 714/703 |
| 2003/0208616 A1 | * | 11/2003 | Laing et al. | 709/236 |
| 2004/0073890 A1 | * | 4/2004 | Johnson et al. | 717/124 |
| 2004/0205406 A1 | * | 10/2004 | Kaliappan et al. | 714/31 |
| 2007/0208984 A1 | * | 9/2007 | Hayhow et al. | 714/742 |
| 2007/0220392 A1 | * | 9/2007 | Bhaumik et al. | 714/742 |

* cited by examiner

*Primary Examiner*—James C Kerveros
(74) *Attorney, Agent, or Firm*—Michael I Toback

(57) ABSTRACT

A device response template generator software program includes an interactive graphical-user-interface (GUI) for sending commands to devices under test and to capture and display the command responses. The GUI enables patternization of the command response to that the information contained in the response can be read, in the form of variable values, automatically, during subsequent execution of the commands by the same device or a group of devices. These values of the variables may be analyzed and may also be sent to other running testing scenarios.

18 Claims, 21 Drawing Sheets

FIG. 1 – (Prior Art)

```
[nlCapability Codes: R – Router, T-Trans Bridge, B – Source Route Bridge
[nl            S – Switch, H – Host, I – IGMP, r – Repeater
[nl
[nlDevice ID      Local Intrfce   Holdtme    Capability  Platform  Port ID
[nlTerminalServer2  Fas 0/1       176        R           2511      Eth 0
[nltgw-3640-2.cisco.Fas 0/1       140        R S I       Cisco 3640Fas 3/0
[nlJAB033303JN   Fas 0/1          128        T S         WS-C2948  2/1
[nlogw-3640-1    Fas 0/1          165        R           3640      Fas 0/0
[nlsingapore#
```

```xml
<A>
        <Version>1.5.2.0</Version>
        <DataType>ASCIIScreen</DataType>
        <BList>
                <B>
                        <Id>Prompt</Id>
                        <stIdx>1164</stIdx>
                        <enIdx>1173</enIdx>
                </B>
                <B>
                        <Id>FreeFormat</Id>
                        <stIdx>1</stIdx>
                        <enIdx>1163</enIdx>
                </B>
        </BList>
        <MList>
                <M>
                <stIdx>1</stIdx>
                <enIdx>21</enIdx>
                </M>
        </MList>
        <VList>
                <V>
                        <Id>int_status</Id>
                        <stIdx>20</stIdx>
                        <enIdx>21</enIdx>
                        <DType>String</DType>
                </V>
                ,<V>
                        <Id> macaddress</Id>
                        <stIdx>85</stIdx>
                        <enIdx>99</enIdx>
                        <DType>String</DType>
                </V>
                <V>
                        <Id>pktinput</Id>
                        <stIdx>670</stIdx>
                        <enIdx>675</enIdx>
                        <DType>String</DType>
                </V>
        </VList>
</A>
```

FIG. 7

| Vlan | Virtual MAC-Address(es) |
| --- | --- |
| 1 | 00-00-0c-07-ac-01 |
| 10 | 00-00-0c-07-ac-02 |
| 20 | 00-00-0c-07-ac-03 |

METHODS AND APPARATUS FOR PATTERNIZING DEVICE RESPONSES

CLAIM OF PRIORITY

This application is a continuation U.S. application Ser. No. 11/277,614, filed on Mar. 27, 2006, now U.S. Pat. No. 7,478,305, entitled "Method And Apparatus For Interactive Generation of Device Response Templates".

BACKGROUND OF INVENTION

1. Field of the Invention

This invention relates generally to the field of testing, provisioning, maintenance and management of a network system, device or a solution. More particularly, the invention relates to the generation of device response templates.

2. Background and Description of the Related Art

In executing a test or communication sequence, a device or a network system can respond with information that is useful for subsequent test or communication steps. Some of it is static in nature, such as its physical identification characteristics. Some of it is dynamic in nature, such as status information about processing results or configuration settings. It is desirable to use this information as input for later test steps, rather than having to manually query the device to update the test cases prior to execution. In order to capture this information, one must analyze device responses to selected commands. These results are not necessarily in a standard format. In the current art of testing and scenario execution, this requires one to either write specialized software to find the patterns in the returned data and transform it into useful variables, or to manually update test sequences. Neither one is a desirable result, as it prevents tests from being automated.

In the prior art, as illustrated in FIG. 1, one would manually step through a test or other scenario sequence until reaching the desired step 101. The step would then be executed 102, and the resulting information captured on the user's display 103. The user would then manually calculate the position of the data value in the response 104 and write customized code 105, which can then be inserted and integrated into a test script 106.

SUMMARY

In one embodiment, an apparatus for generating a device response template through patternization for a device under test (DUT) is disclosed. The apparatus includes a computer coupled to the DUT through a network system. The DUT provides a support for a plurality of commands. The apparatus also includes a data storage coupled to the computer to store said device response template, and a command user interface coupled to the computer to send selected ones of said plurality of commands to the DUT. A response capture user interface is included to display a device response from the DUT for the selected ones of plurality of commands. The response capture user interface enables a user to mark a block of data in the device response. The device response template includes information to enable extraction of values associated with the DUT and the network system from the device response.

In another embodiment, a computer implemented method for patternizing a device response of a device is disclosed. The method includes sending a command to the device and receiving the device response from the device. The device response including a plurality of parameters. The method further includes defining a parameter pattern within the plurality of parameters in the device response, and assigning a type to the parameter pattern.

In yet another embodiment, a computer readable media having programming instructions for patternizing a device response of a device is disclosed. The computer readable media includes programming instructions for sending a command to the device and programming instructions for receiving the device response from the device. The device response including a plurality of parameters. The computer readable media includes further includes programming instructions for defining a parameter pattern within the plurality of parameters in the device response, programming instructions for assigning a type to the parameter pattern.

BRIEF DESCRIPTION OF THE DRAWINGS

FIG. 6 illustrates an example of a captured command response in accordance with one or more embodiments of the present invention.

FIG. 7 illustrates an example of a template stored as XML in accordance with one or more embodiments of the present invention.

FIG. 18 shows an example of selecting a line table in accordance with one or more embodiments of the present invention.

DETAILED DESCRIPTION

The term device under test (DUT), as used herein, describes either a single device of a group of devices coupled together. In the examples below, methods are being shown to be performed by a test developer or a user for the sake of easy understanding. It should be noted that one or more of these methods can also be performed through programmed scripts and other means in non-interactive fashion.

The word "test" as used in this document means that a command is being sent to the device or the network system and a response is received. The purpose of such sending the command and receiving the response could be either testing the device or the network system or simply for eliciting certain variable values from the device or the network system for the purpose of provisioning, maintenance, or management. Further, word "DUT" is being used in this document illustrates a device or a network system.

As used herein, the term scenario refers to a sequence of steps where at each step, communication is initiated to a device and responses can be validated against a range of expected responses at each step. One embodiment of this would be a test case. Another embodiment would be a system calibration process.

In one or more embodiments, a test designer is enabled to define references to values contained in the device response without having to write code and rebuild the test every time the response is changed. A template can be used to generate a list of header information to enable the determination as to whether the response from the device is valid. In one or more embodiments, the template can be used to determine whether one or more fixed strings (called markers) within the response can be used to find values within a block of text, a list of blocks of a specific structure, or a list of variables contained in those blocks of a specific type. Multiple templates can be defined for a given command response, based on the blocks and variables defined. A specific template can then be used to extract values from the response to a command and those values can be used in subsequent steps.

Figure 1:
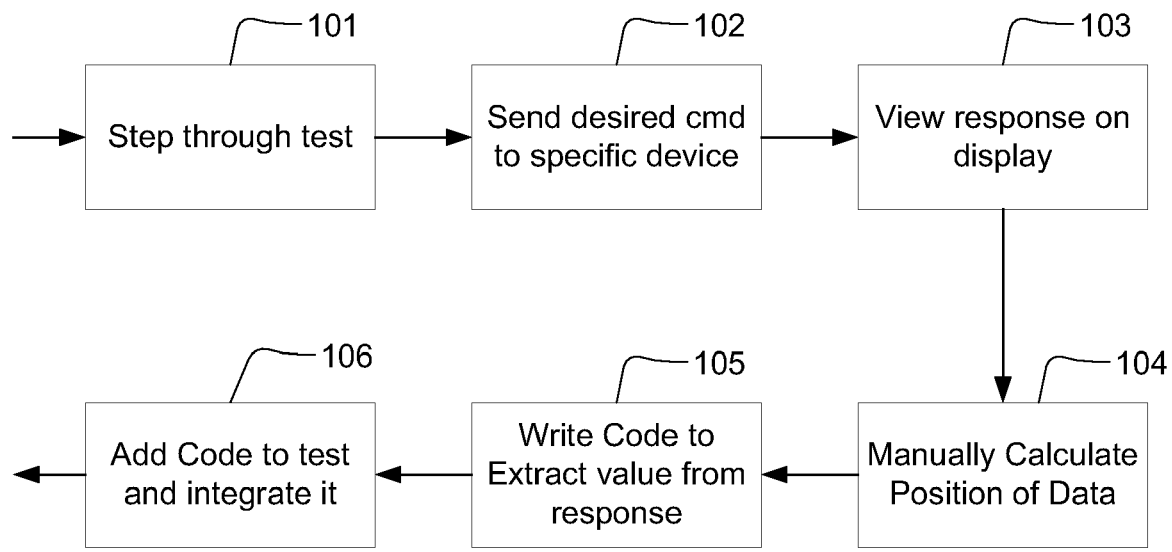
FIG. 1 illustrates the process of adding variables from test results into a test in the prior art.
Figure 2:
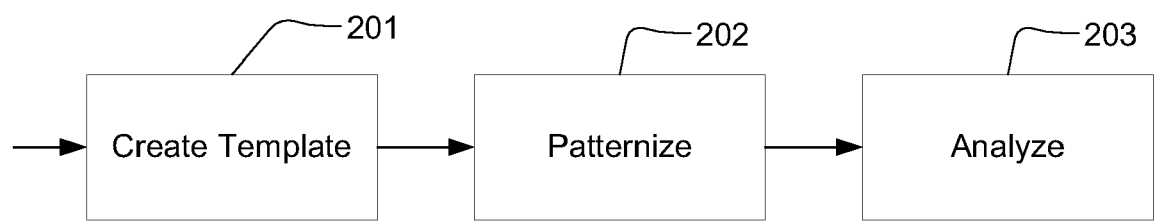
FIG. 2 illustrates a general process of creating device templates in accordance with one or more embodiments of the present invention.

In one or more embodiments, the process for using a template can be broken into three modes of operation as shown in FIG. 2. First, in the create template mode, a template is created by designating the device and command, then setting up a command to send to a device, at step 201. The captured response can then be used in the patternize mode, at step 202, in which patterns are identified in the data that can be used to extract the values of interest. Finally, once the template patterns have been identified and the template has been saved, a template can be used in the analysis mode, at step 203, to extract values in a live sequence for use in later steps.

Figure 3:
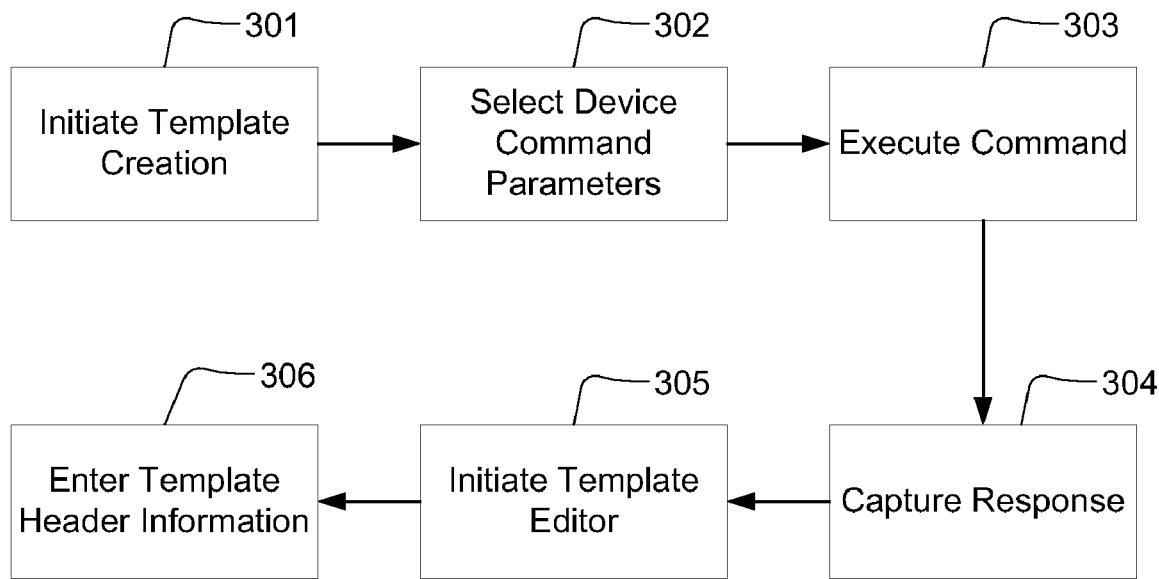
FIG. 3 illustrates another process of creating device templates in accordance with one or more embodiments of the present invention.
Figure 8:
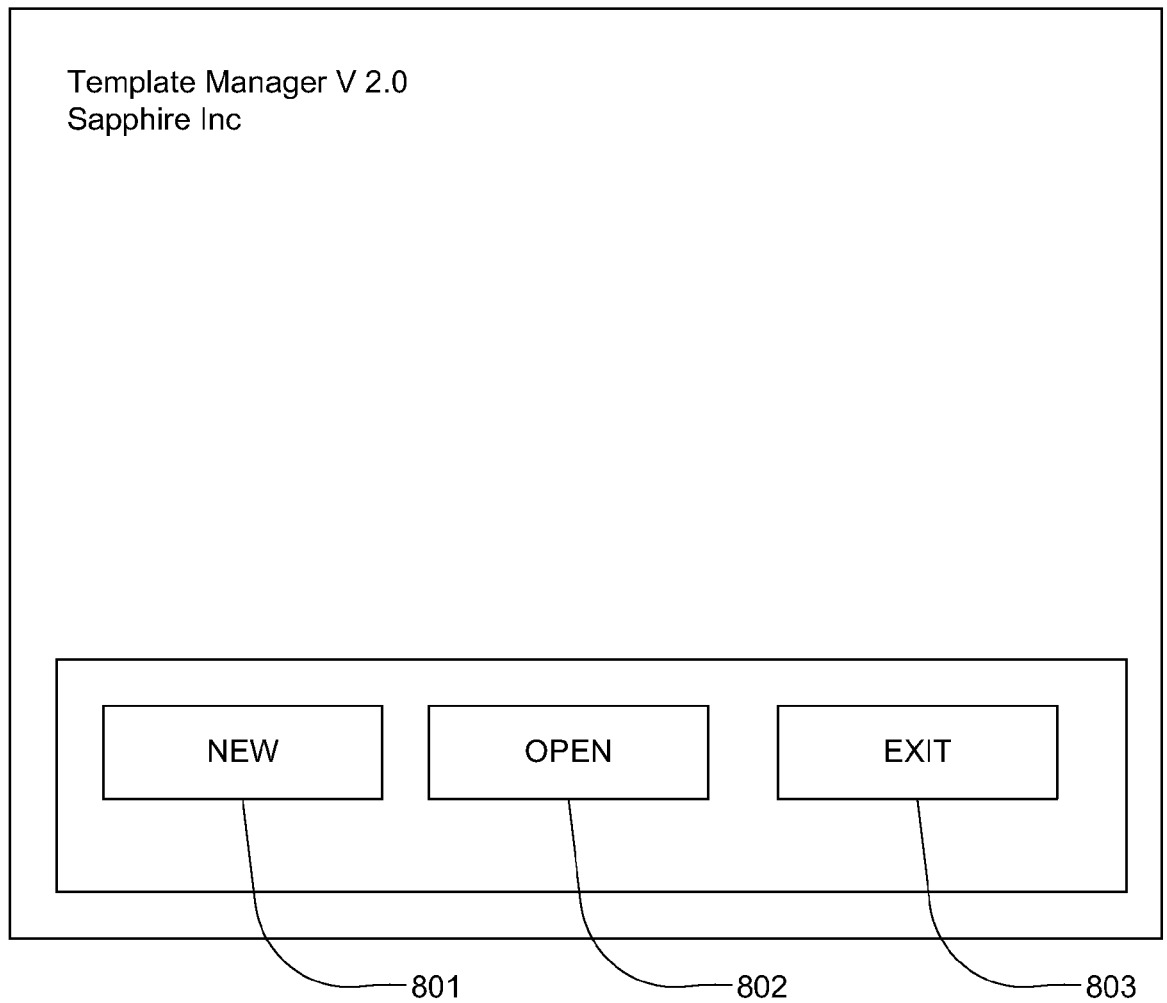
FIG. 8 illustrates an example of the program startup display in accordance with one or more embodiments of the present invention.

A process for the creation of a response template in accordance with one or more embodiments is shown in FIG. 3. At step 301, a template is initialized. At step 302, a prompt is given to send a command to a device. At step 303, after the command is executed, the response to the command is captured, at step 304, and displayed in a template editor, at step 305. An implementation of the template editor in one or more embodiments is shown in FIG. 8. In one or more embodiments, once the initial template display is presented appropriate header information can be entered. In one or more embodiments, the header information is needed in order to identify the template, such as a name for the template and type of data (e.g., ASCII or binary for example), at step 306.

Figure 4:
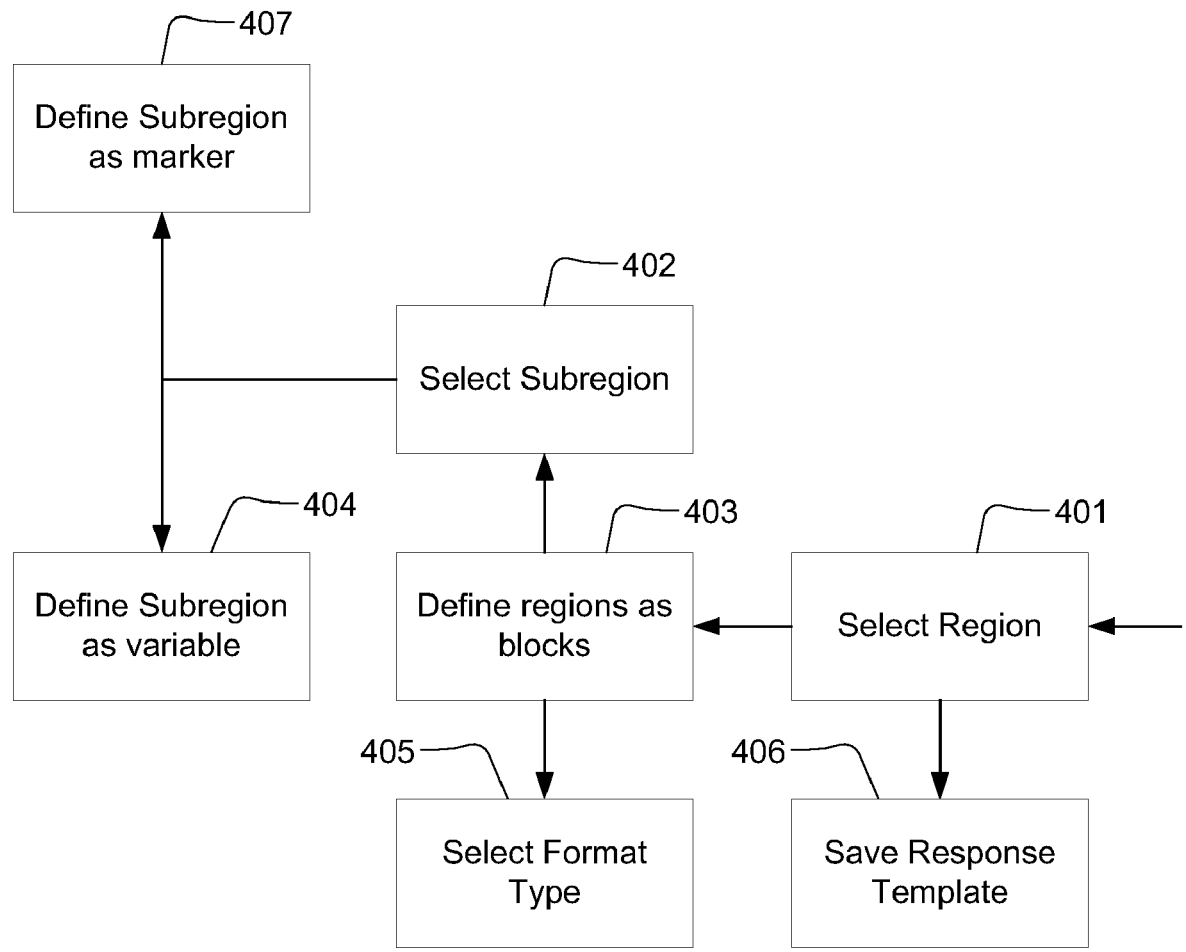
FIG. 4 illustrates a process of patternization of a device response in accordance with one or more embodiments of the present invention.

After the template is initialized and the header information is added, in one or more embodiments, the patternization mode is entered, as illustrated in FIG. 4. Regions of the response may then be selected, at step 401. In one or more embodiments, this is done with an appropriate pointer device (e.g., a mouse). In one or more embodiments, the selected regions can then be designated as blocks, at step 403. At step 405, a type of the selected block may be designated once the block is selected. The type of a block includes command, prompt, table, line item, and free format. At step 402, regions within those blocks may then be selected and designate those subregions either as block (step 403), markers (step 407) or variables (step 404). In one or more embodiments, the designation of the selected subregion can be done with an appropriate pointer device. In one or more embodiments, once the template definition is complete, it can be stored for later use, at step 406.

Figure 5:
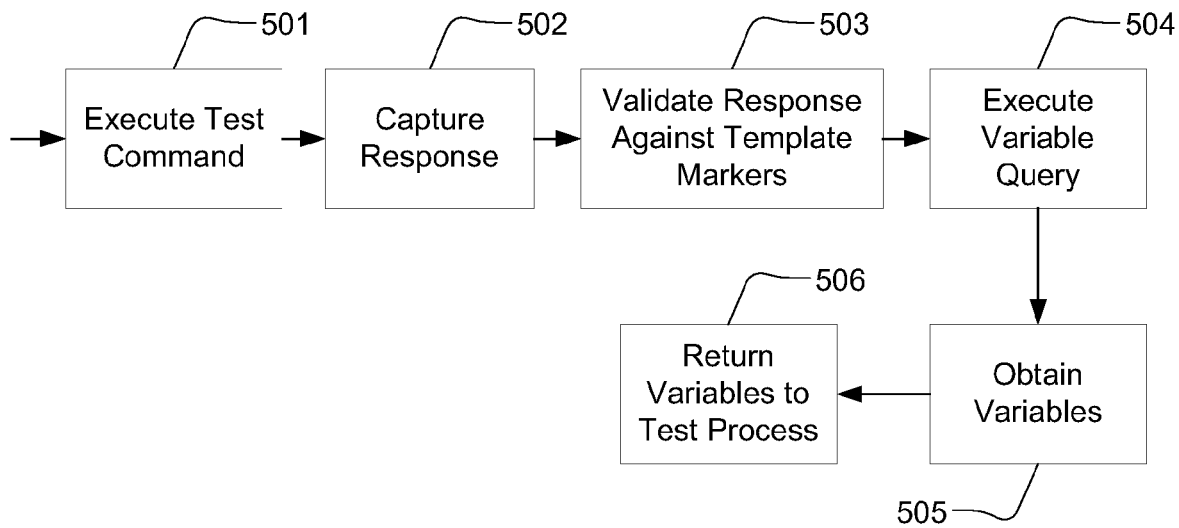
FIG. 5 illustrates a process of obtaining variables from a response template in accordance with one or more embodiments of the present invention.

In the analysis mode, a template is selected to be used in a scenario step on receipt of the same or similar device response. As shown in FIG. 5, after the matching command is executed, at step 501, the response is captured, at step 502, and the validation steps are executed, at step 503. In one or more embodiments, the validation consists of comparing any strings designated as associated with a region to the content of the response to validate that it is the expected response. In one or more embodiments, a search for variables associated with the template will be executed, at step 504. In one or more embodiments, the search for variables consists of searching for a string pattern in the response via a regular expression or other pattern matching algorithms to allow the process to align itself and find a block which contains one or more variables. In one or more embodiments, values can be found for one or more selected variables, at step 505. The variables are then stored for use in later steps, at step 506.

Figure 20:
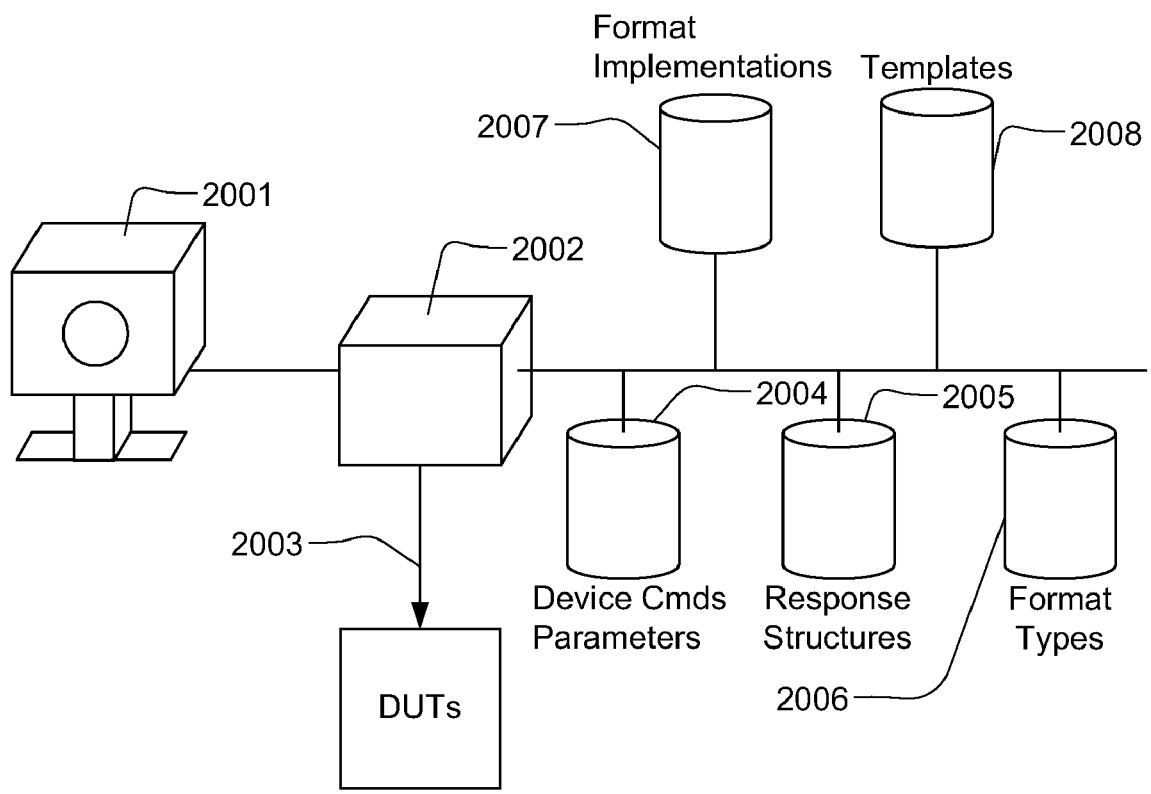
FIG. 20 shows one embodiment of the apparatus for patternizing a command response in accordance with one or more embodiments of the present invention.

An embodiment of a system for creating device response templates is illustrated in FIG. 20. In one or more embodiments, the system provides a unified user interface 2001, a computer 2002, interface to DUTs 2003, storage for device commands and the parameters required 2004, storage for response structures and substructures 2005, storage for available response format types 2006, storage for implementations of those format types 2007, and storage for the resultant response templates 2008.

FIG. 8 shows an embodiment of a user interface to enable a user to interact with the system for creating device response templates. In this or similar embodiments, the user selects the "New" button 801 to initiate a template creation session, the "Open" button 802 to open and edit an existing response templates, or the "Exit" button 803 to end the session. In another embodiment, a command is executed from a command line interface to initiate a template session, given the template name or some setting to show this is a new template.

Figure 9:
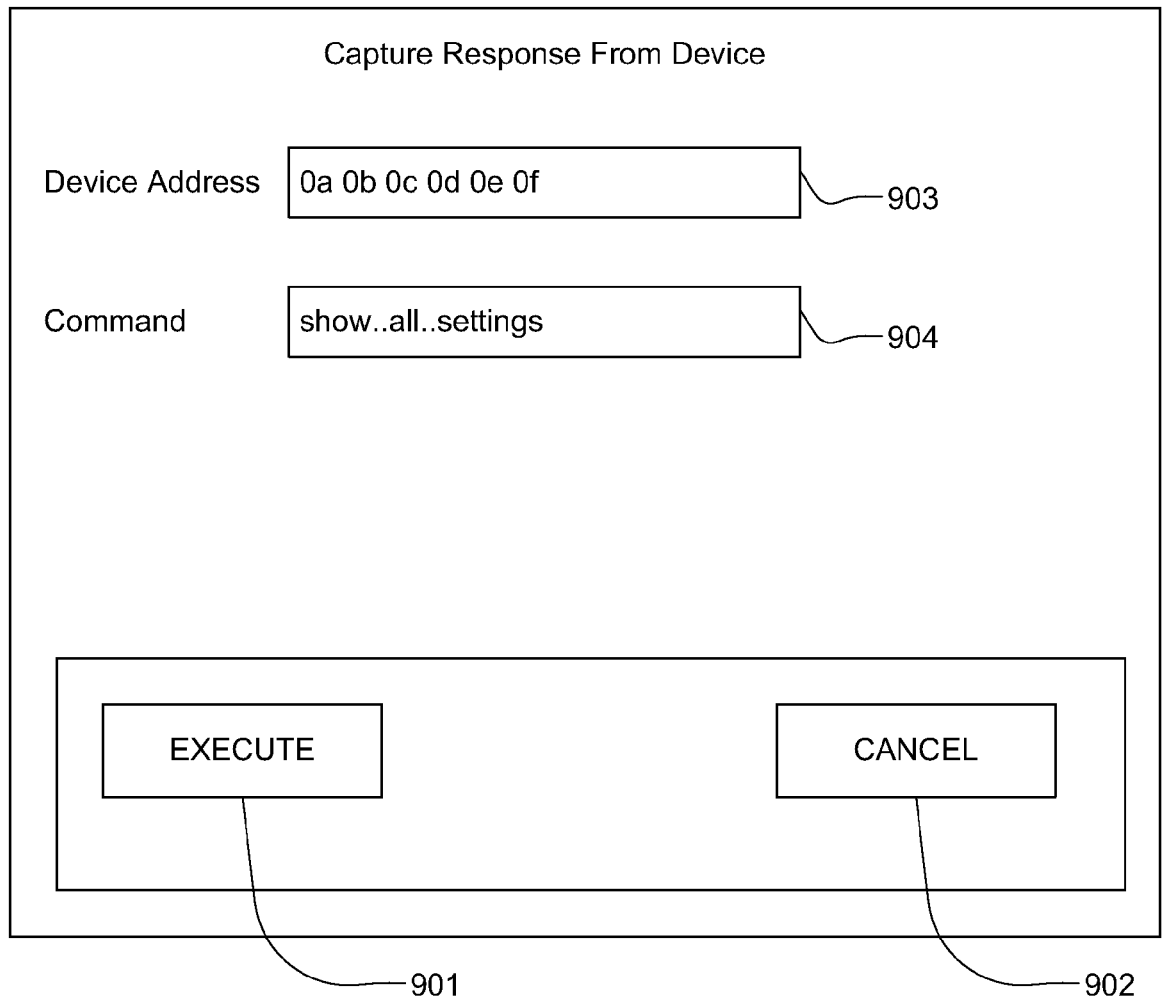
FIG. 9 illustrates an example of the template initiation display in accordance with one or more embodiments of the present invention.

In one or more embodiments, a display such as in FIG. 9 is shown after a new template session is started. In one or more embodiments, the display shows the data entry fields for a device address 903 and a command to be sent to a device 904. The user would either select the "Execute" button 901 to cause the command to be sent to the device, or the "Cancel" button 902 if the user wishes to exit the template without saving it.

Figure 10:
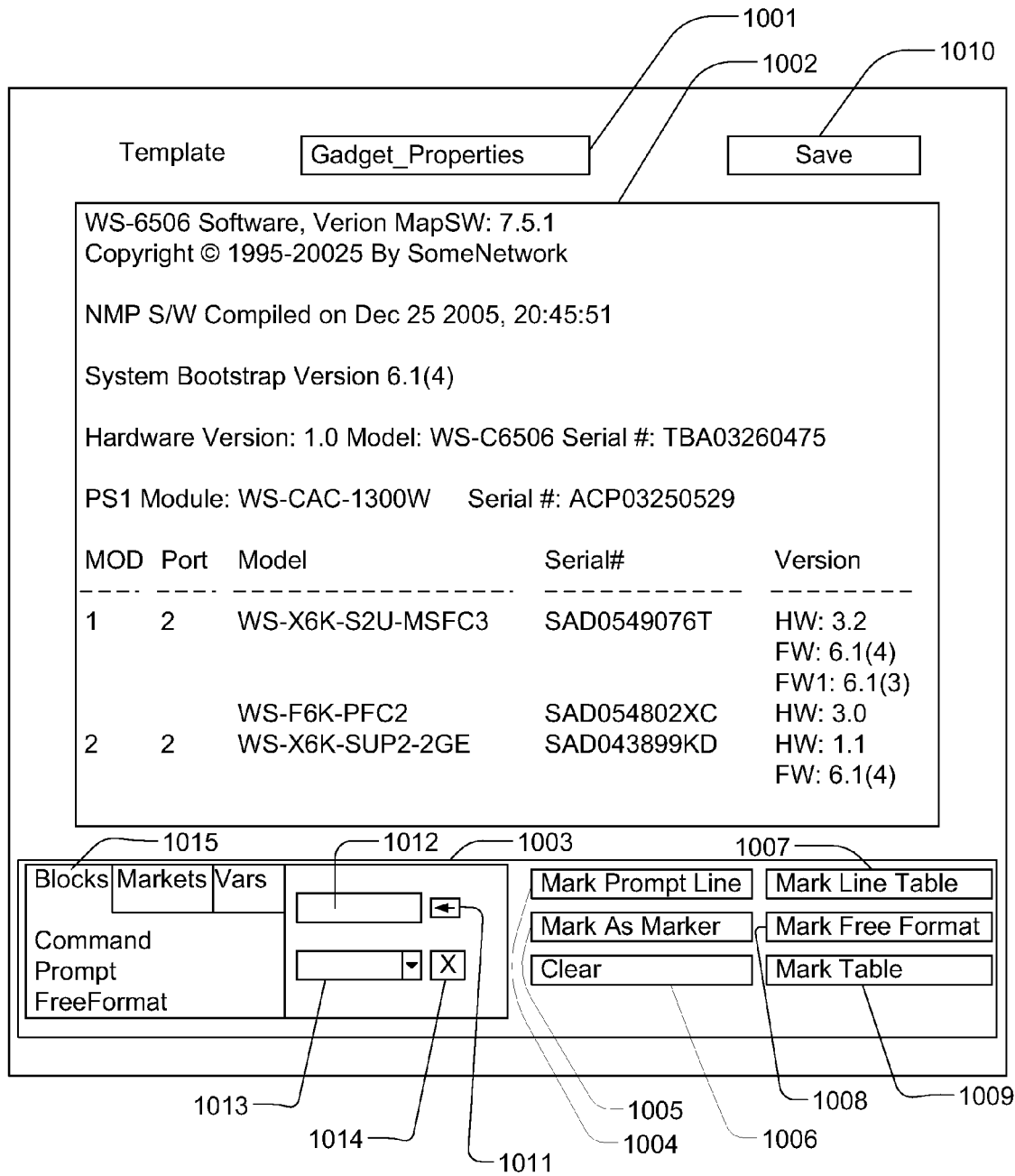
FIG. 10 shows an example of the template screen after the response was captured for patternization in accordance with one or more embodiments of the present invention.

In one or more embodiments, the resulting device response is captured and a display similar to that of FIG. 10 would be presented to the user after executing the command. The template then can be associated with blocks, markers, and variables in one or more embodiments. At some point prior to saving the template, the name of the template would need to be defined 1001.

In one or more embodiments, the process of patternizing template device response involves selection of the text from the captured response area 1002, followed by selecting a block or field type as displayed in the button area 1003. At that point, a selected type will be associated with the selection text region. In one or more embodiments, the defined region will be made available to validate the use of the template with the device response, locate a variable within the response, or return the value of a variable within the response.

In one or more embodiments, the "Mark Prompt Line" button is selected when an area selected in the captured response area is to be used for validating the screen 1004. The value of the prompt line is then stored and associated with that template, such that after the template is saved it can be used to validate that the value returned during the scenario execution is one that this template can be used with.

In one or more embodiments, selecting the "Mark as Marker" button designates an area selected in the captured response area is for use to mark the location of a variable within a free format region 1005. In one or more embodiments, the location of the last character of the marker is used to mark the end of text on the line and the next non-whitespace value after that is a variable.

In one or more embodiments, selecting the "Clear" button removes a selected region from the template 1006. Once an area or subregion is removed, any information about that region or subregion is not stored with the template and so any variables associated directly or indirectly with that region will no longer be accessible.

Figure 16:
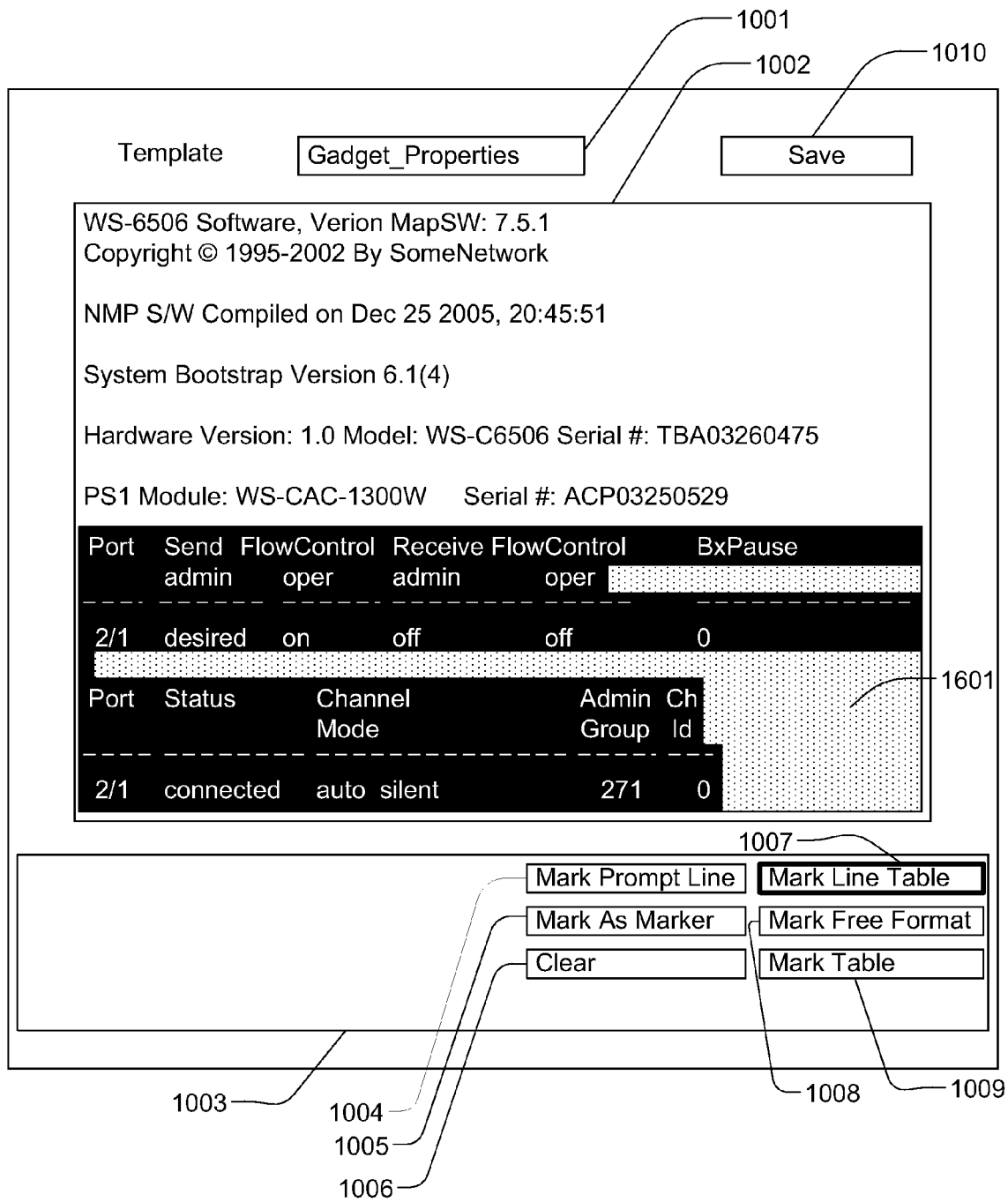
FIG. 16 shows an example of a column being defined in a table in the captured response in accordance with one or more embodiments of the present invention.

In one or more embodiments, when an area selected in the captured response area is to be used as a line table 1007 the "Mark Line Table" button should be selected. As shown in FIG. 16, a line table is a table which consists of a header and a single row of data, which may extend to multiple lines 1601. In one or more embodiments, the line table contains a single value of multiple variables (e.g., one per column) that can be used by selecting the column and entering a variable name and type to associate with it. The value can then be provided in a test step if queried for by that variable name.

In one or more embodiments, the "Mark Free Format" button should be selected when an area selected in the captured response area is to be used as a free format region 1008. The free format region defines an area of text that has no form or format except to consist of contiguous characters. Markers can then be defined in the free format region to enable locating a variable value in the free format region.

Figure 14:
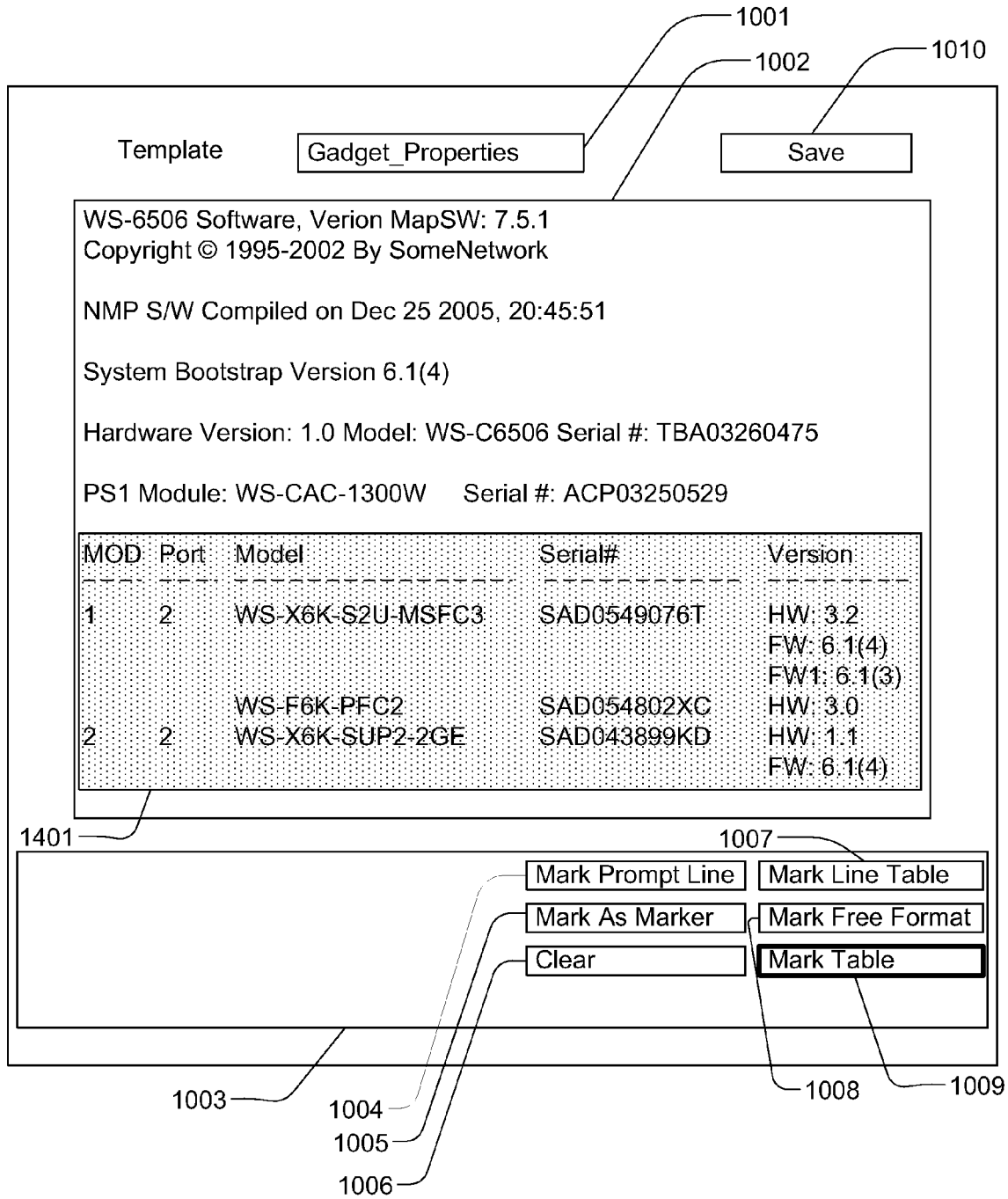
FIG. 14 shows an example of defining a selection of a table in the captured response in accordance with one or more embodiments of the present invention.

In one or more embodiments, the "Mark Table" button can be selected when an area selected in the captured response area is to be used as a table 1009. In one or more embodiments, a table consists of a header and one or more rows of data. The table enables one to return data based on any of a variety of queries that would be applicable to a table structure, such as a value in the second row associated with a specific column or a value in one column in the same row as a specific value for an item in another column. This can be enabled by associating the value with a variable. For example, as illustrated in FIG. 14, the table area 1401 contains a column called 'MOD'. A query variable may be created for retrieving value of column 'serial #' by storing a query filter with the variable to be created to retrieve a particular value in the column 'serial #' by associating a query (such as 'get value of serial# where value of MOD=2'). In another embodiment, a query can be defined by enabling a structure called a dynamic variable in the runtime request from the scenario execution step that can search the table to retain the value. The value of a dynamic variable is provided either by the user or from the output of another running scenario.

In one or more embodiments, the "Save" button is selected to store the completed template or template-in-progress on completion of processing a template.

In one embodiment, templates are stored in the computer file system. In other embodiments, a template is created in the form of a portable document, which can then be stored in different types of storages, including databases, either locally or on a remote server.

In one or more embodiments, information about the device and the command for which the template was created can be associated with the template enable browsing and searching for a desired template.

Patternization is a process of selecting various regions or subregions within those regions to define variables, markers for variables, or strings for validating the response. In one or more embodiments, sections of the response can be selected as blocks, markers, prompts, or variables. A variable is defined in a template by mapping a name and format to a specific area in the command response and assigning a data type. Defining variables in the response template enables the retrieval of specific variable values from a command response during the scenario execution.

Blocks are regions of the display that may contain other structures. The current definition includes tables, line tables, and free format areas, but can also include a web service response (e.g., html or xml marked up stream), binary formatted data, and any other parsable string of bytes. By adding new format types and appropriate substructures, the definition of a block can be expanded to include any data structure that can be represented as a text stream. For instance, an html string is a stream of characters such that it only makes sense to select specific subblocks; regions which start and stop with the same tag at the same level. In one or more embodiments, it is possible to represent a binary stream as a pair of hex values for each byte, making sure that one cannot define a region by splitting a byte (i.e., must always start and stop on an even boundary). In other embodiments, more complex binary structures would require more complex parsing, search and subregion definitions.

In one or more embodiments, blocks are marked and defined in the template before defining or creating variables. Marking the blocks is necessary because at run time or in successive command responses to the same command, the variable may not appear at the same location with respect to the start of the command response. Defining the blocks in which the variable appears provides a reference to parse the variable value.

Markers are strings that are used to align the search for a variable. In one more embodiments, the next non-whitespace value after the end of the marker is a variable.

Variables are named values of a specified format that are accessible through a template and the value is set through the response associated with the template as verified by one or more prompt lines.

Figure 11:
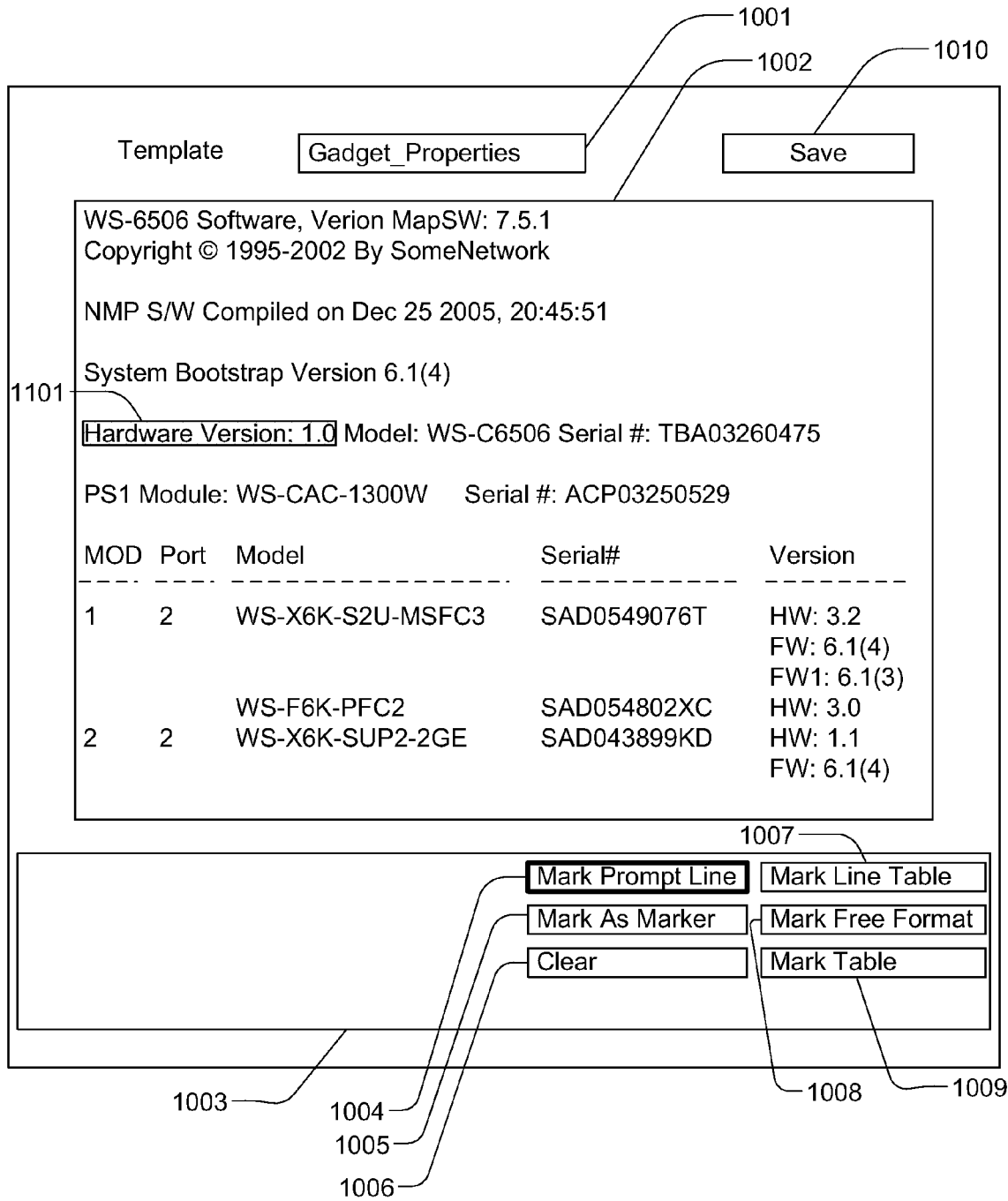
FIG. 11 shows an example of selecting a prompt line in the captured response in accordance with one or more embodiments of the present invention.

In one or more embodiments, the "Mark Prompt Line" button 1004 is enabled when a single line or part of a single line is selected 1101, as shown in FIG. 11. In one or more embodiments, the resulting prompt line is a fixed text and can be used to validate that the response returned can be analyzed using the template.

Figure 12:
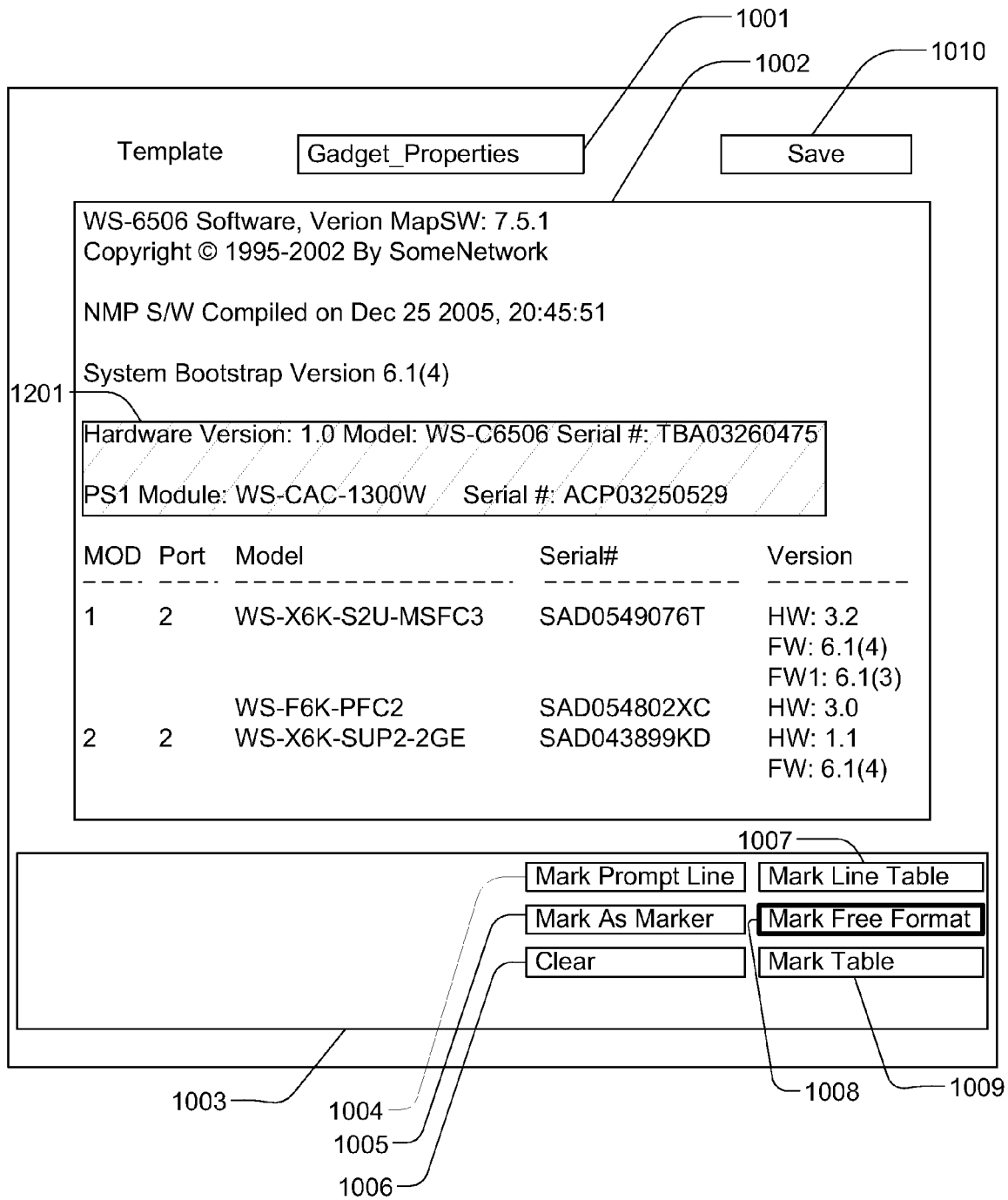
FIG. 12 shows an example of defining a free format region in the captured response in accordance with one or more embodiments of the present invention.
Figure 13:
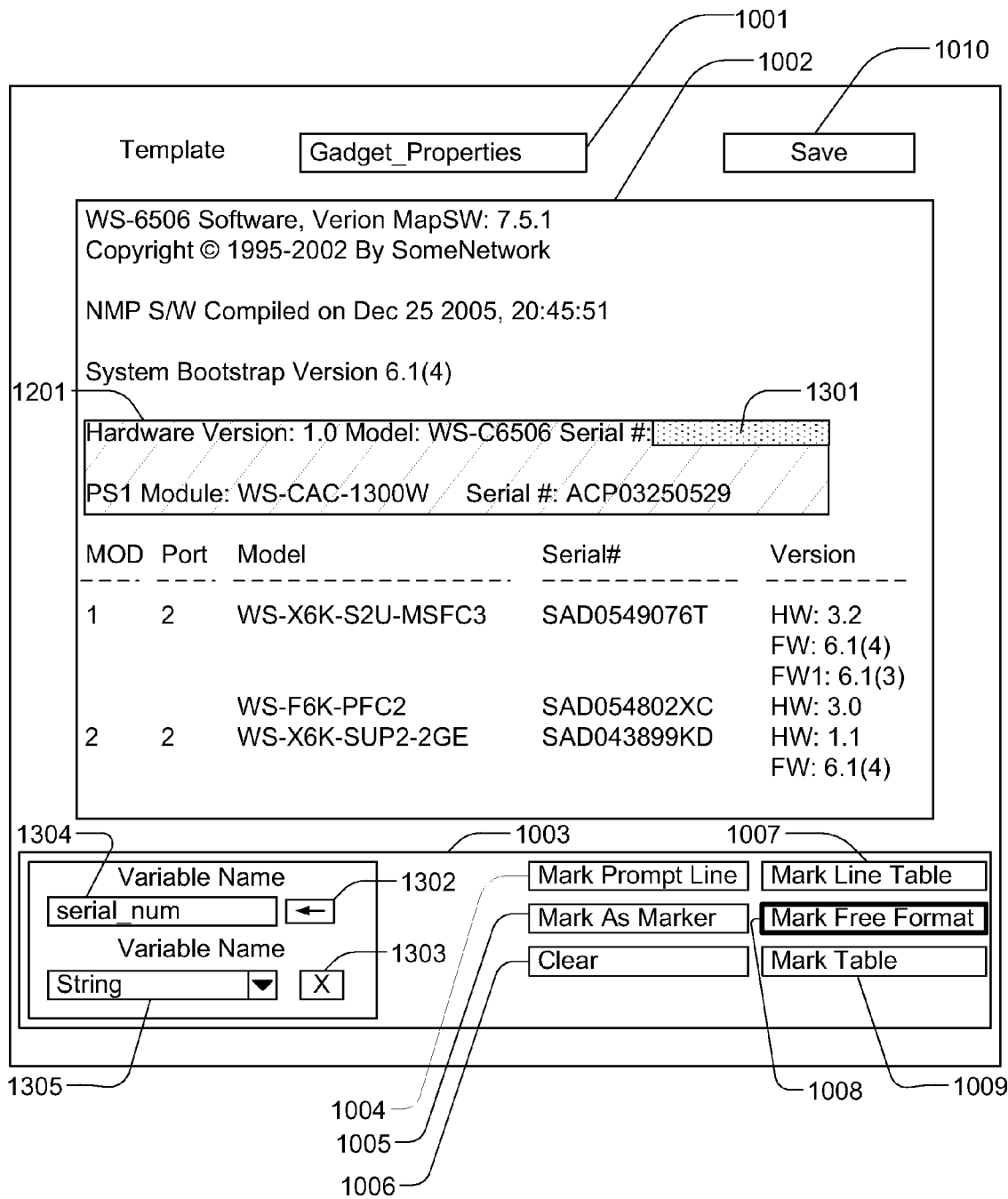
FIG. 13 shows an example of defining a variable in a free format region in accordance with one or more embodiments of the present invention.

In one or more embodiments, "Free Format" can be marked by selecting a region 1201 and selecting the "Mark Free Format" button 1008 as shown in FIG. 12. In one or more embodiments, adding a variable from a free format block can be done by highlighting the exact space in which the value of the variable is most likely to appear, as illustrated in FIG. 13. For example, if a 4 letter value is expected for a particular variable, select 4 spaces, then enter the name of the variable in the variable name field 1304 and select an appropriate data type in the variable type 1305. In one or more embodiments, select the enter button 1302 to add the variable and the variable is created and stored in the template. If the variable is not to be created, in one or more embodiments, a cancel button 1303 is provided to clear the definition.

Figure 21:
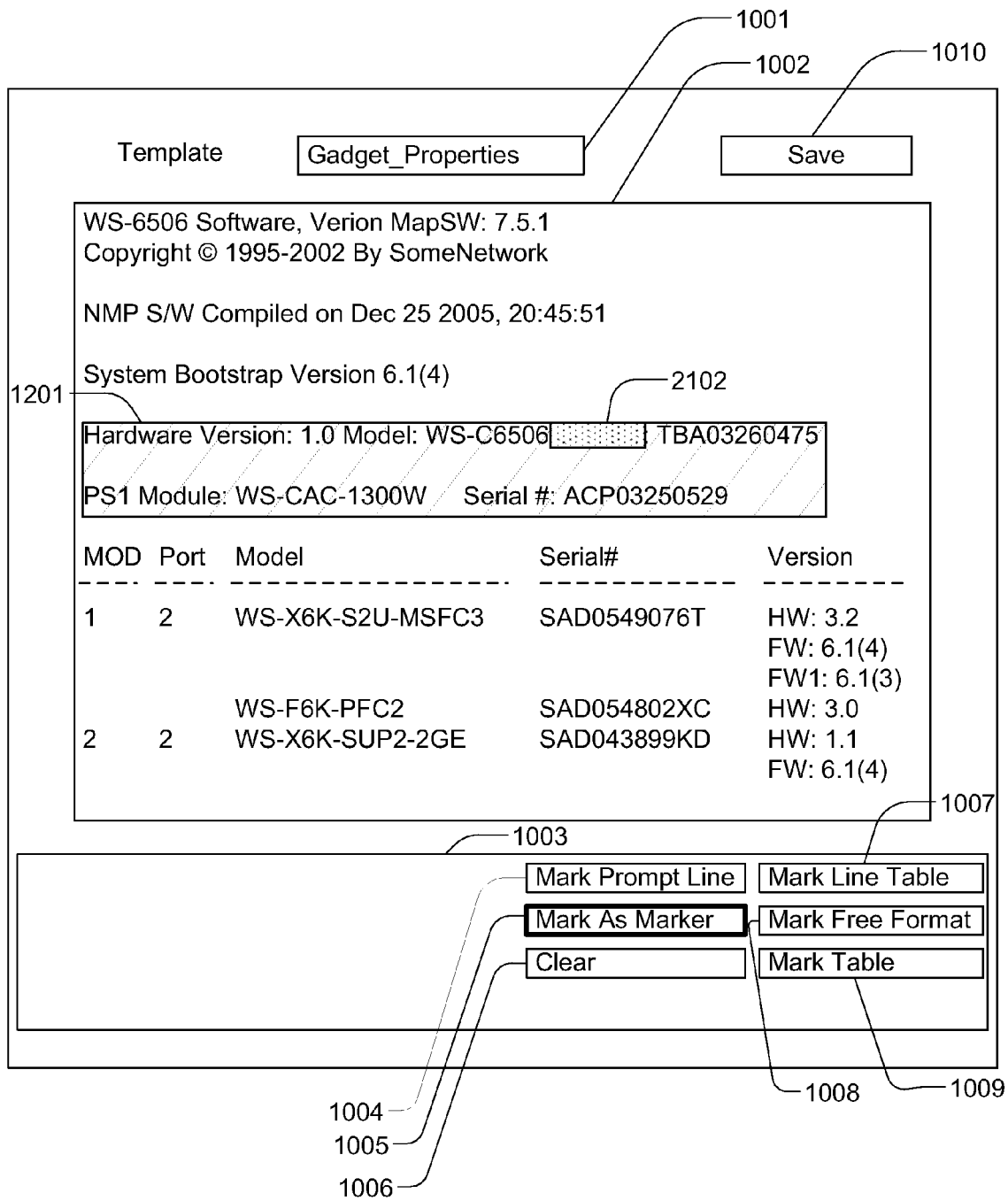
FIG. 21 shows the act of defining a marker for a free format region in the captured response in accordance with one or more embodiments of the present invention.

In one or more embodiments, the "Mark As Marker" button 1005 would be enabled when a single line or part of a single line is selected within a free format region as shown in FIG. 21, The resulting marker is used to define the region of the display where a variable can be found. For instance, in 1002, the string "serial #:" can be used to mark the beginning of a serial number 2102. Once the location of the string "serial #:" is determined, then it would be assumed that the first string after any white space found would be a variable.

A "Mark Line Table" is defined to be a special type of table which contains only one row of data and a table header. As shown in FIG. 16, the row may be displayed in multiple rows and the row may have more fields than can be displayed on one line. In one or more embodiments, in order to select a line table, a desired area on the console 1002 is selected and the "Mark Line Table" button 1007 is clicked. In one or more embodiments, the selected block 1601 encompasses both names of the variables and values.

Figure 17A:
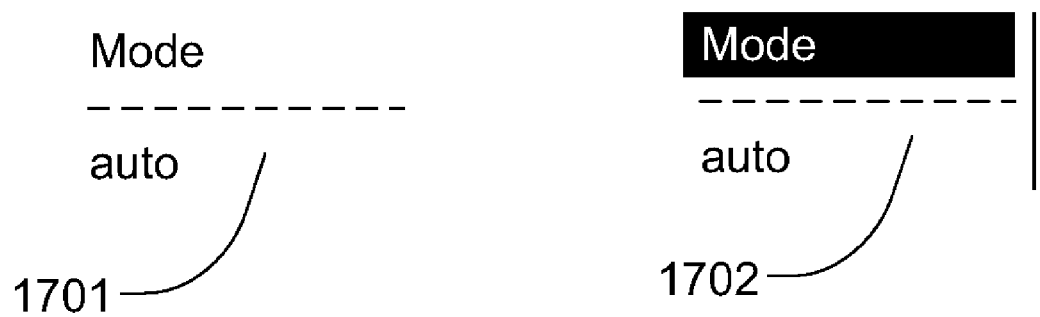
FIGS. 17a and 17b shows an example of defining a variable in a table and free form area respectively in accordance with one or more embodiments of the present invention.

FIG. 17*a* illustrates an embodiment of an unmarked 1701 and marked 1702 Line Table variable. In one or more embodiments, to add a variable from a Line Table, the name of the variable would be highlighted (e.g., variable 'mode' in FIG. 17*a*), then extending the marking to the entire area under which the variable value is most likely to appear. In one or more embodiments, this length of marking is to be used to be long enough to store the maximum length of the desired variable value. Enter the name of the variable and select an appropriate data type and click the button to add the variable. The variable is created and stored in the template.

Figure 17B:
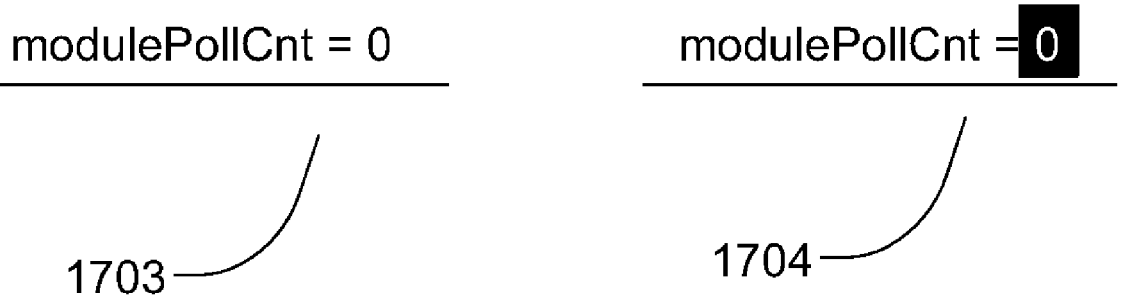

FIG. 17*b* illustrates adding of a variable from a free format region as would be defined in one or more embodiments. In these or other embodiments, a subregion 1703 in a free format block contains a variable which is added to the template by selecting the value as being displayed 1704 on the console including the surrounding white spaces where the value of the variable is most likely to appear. This length of marking is used to store the maximum length of the variable value. Enter the name of the variable and select an appropriate data type and click the button to add the variable. The variable is created and stored in the template.

Figure 19:
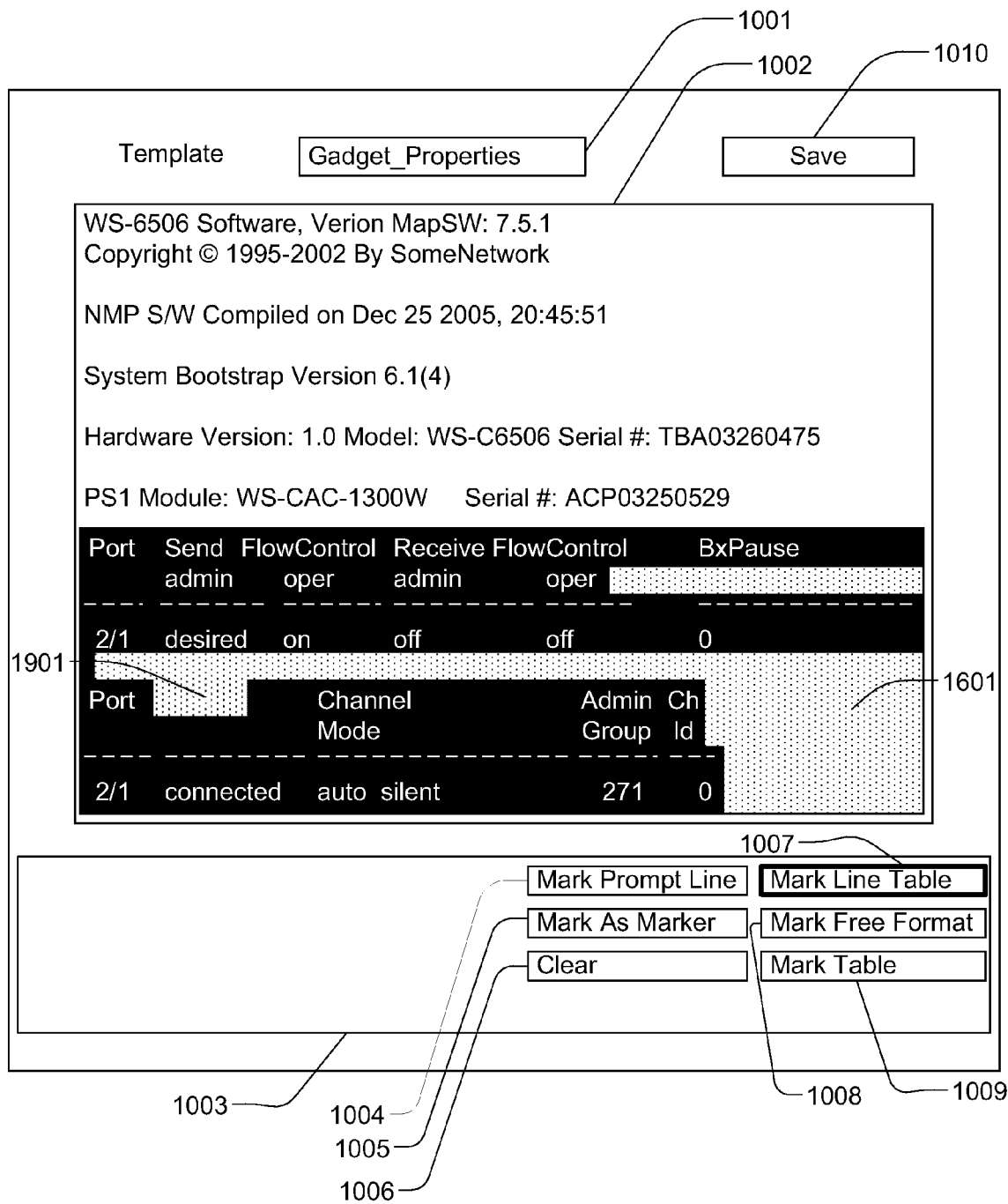
FIG. 19 shows an example of selecting a variable in a line table in accordance with one or more embodiments of the present invention.

FIG. 19 shows a line table in a context, where the line table 1601 has a variable status selected 1901.

In one or more embodiments, the current value of a variable as contained in the captured response area 1002, is displayed under the caption "current value" when an existing variable is selected.

Figure 15:
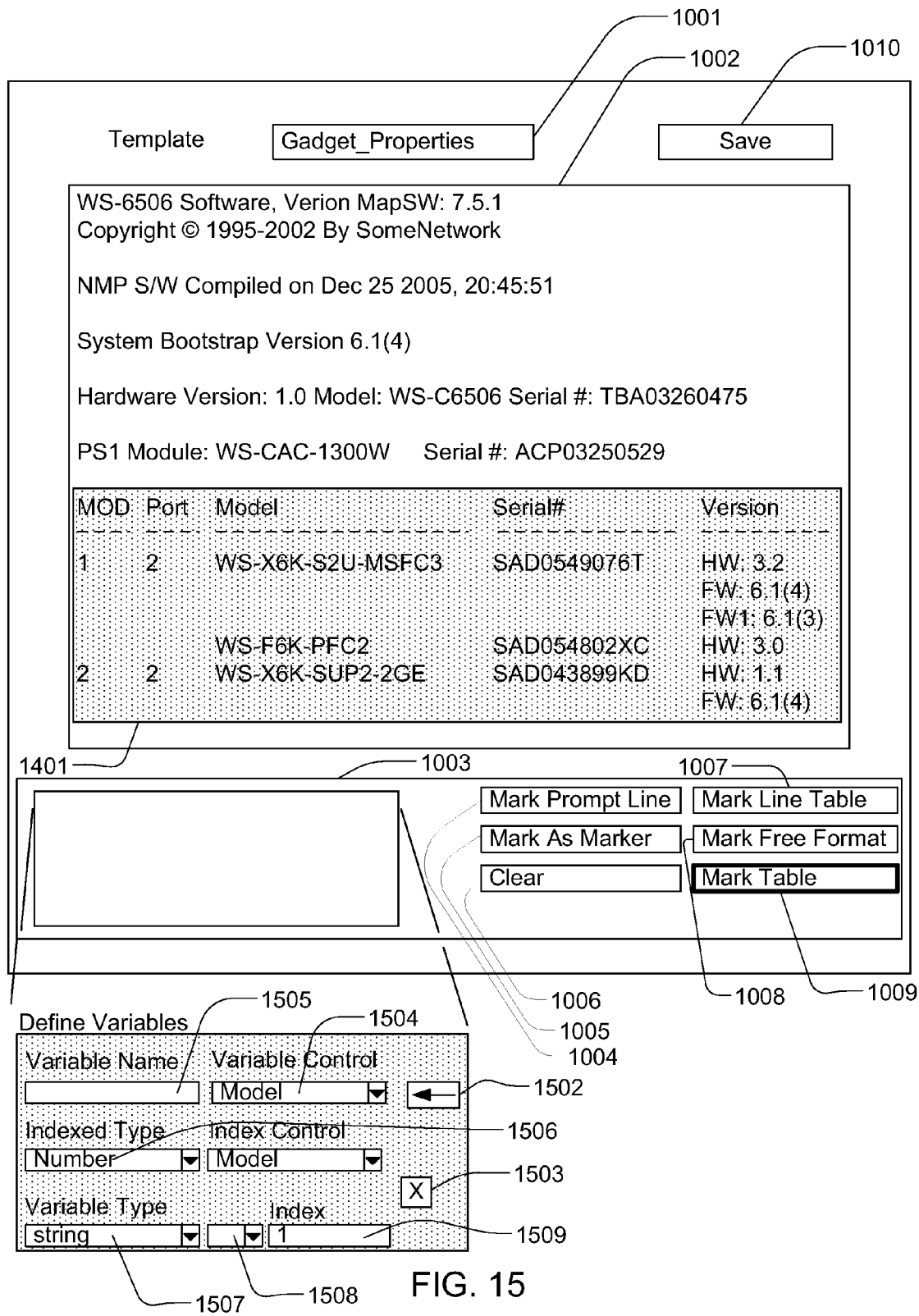
FIG. 15 shows an example of a table header being selected in the captured response in accordance with one or more embodiments of the present invention.

In one or more embodiments, table columns are defined after creating or defining a Table Area. In these or other embodiments, to define a table column, highlight the column header 1801. Extend the marking to the entire area under which the variable value is most likely to appear. This length of marking is to be used to store the maximum length of the variable value. Click on "Mark Table Header" button. The column header name is used as a default variable name for the column header. For example, the default variable name for the Vlan column would be Vlan. A new name may be given. For example, to create a variable Vlan0 to store the value of the first row of the Vlan column, as illustrated in FIG. 15, type "Vlan0" in the "Variable Name" box 1505, select Vlan from the "Variable Column" box 1504, select "Number" from the "Index" box 1506 and type "0" in the "Index" box 1509. To create a variable VirtualMACVlan10 that will store the value of the Virtual MAC column on the same row with a value of 10 in the Vlan column, type "VirtualMACVlan10" in the Variable Name box 1505, select VirtualMAC from the Variable Column box 1504, select Column Value from the Index Type 1506, select Vlan from the Index Column 1510, select String from the Variable Type box 1504, and type "10" in the Index box 1509. This process is repeated for other table headers.

In one or more embodiments, multiple values are selected from a column of a table by entering a variable definition that defines separate variables referencing each value. For instance, in the selected table in FIG. 13, one could create a variable called Mod1Serial to get the serial # where index type is value index column is MOD, variable type is String and Index is 1. Then create a variable called Mod2Serial to get the serial # where index type is value index column is MOD, variable type is String and Index is 2. For this example output, Mod1Serial would return the value SAD0549076T and Mod2Serial would return the value SAD043899KD.

In one or more embodiments a dynamic variable can be defined during the scenario execution that returns a value associated with a column based on a value defined previously in the scenario from another column. For example, a dynamic variable ModSerial, which defines a MOD value and returns the serial # would return SAD0549076T for a MOD value of 1 and SAD043899KD for a MOD value of 2.

In one or more embodiments, the "Save" button is selected to save the template on completion. In one embodiment, the template is stored in a database, in a format that captures the relationships between the blocks, markers, and variables, such as XML. However, it may be understood by a person skilled in the art that the template may also be converted in a different type of format and can be stored in other type of storage. After storing the template the user would be returned to the screen shown in FIG. 8. Another embodiment would be to include a separate "Exit" button to leave the display, and the "Save" button would simply update the stored version of the template.

FIG. 6 shows a sample response to a command as stored 600. In this example, the start of a line is coded as "[nl" so it can be stored in a single entry and restored as required, preserving line breaks from the actual response. It should be noted that It may be understood to a person skilled in the art that "[nl" is simply a marker and other characters may be used instead.

FIG. 7 shows a template derived from this sample response formatted as an XML string as would be defined in one or more embodiments. It contains header information, one or more marker (m) in a list of markers (mlist), one or more blocks (b) in a list of blocks (blist), and one or more variables (v) in a variable list (vlist). The header information provides enough information to restore it. In this case, a version number and data type will enable the identification of the proper version of the code to interpret the header.

It should be noted that it may be understood to a person skilled in the art that protocols and formats other than XML can also be employed to store or persist variables and template.

In one or more embodiments, the user interface may provide retrieval of stored templates. In these or other embodiments, the user interface enables the user to select a desired template and run desired scenario. The device response from the DUT is parsed according to the variable definitions stored in the device template and the user is enabled to see the value of a desired variable. In one or more embodiments, the list of all the variables in the template is displayed to the user on demand. A user may make a selection of one or more variables to see the value of the variable. A user may also see a list of other running scenarios and chose to send values of desired variables to these other running scenarios.

With the above embodiments in mind, it should be understood that one or more embodiments of the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of one or more embodiments of the invention are useful machine operations. One or more embodiments of the invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The programming modules and software subsystems described herein can be implemented using programming languages such as Flash, JAVA™, C++, C, C#, Visual Basic, JavaScript, PHP, XML, HTML etc., or a combination of programming languages. Commonly available protocols such as SOAP/HTTP may be used in implementing interfaces between programming modules. As would be known to those skilled in the art the components and functionality described above and elsewhere herein may be implemented on any desktop operating system such as different versions of Microsoft Windows™, Apple Mac™, Unix/X-Windows™, Linux™, etc., executing in a virtualized or non-virtualized environment, using any programming language suitable for desktop software development.

The programming modules and ancillary software components, including configuration file or files, along with setup files required for providing the method and apparatus for troubleshooting subscribers on a telecommunications network and related functionality as described herein may be stored on a computer readable medium. Any computer medium such as a flash drive, a CD-ROM disk, an optical disk, a floppy disk, a hard drive, a shared drive, and storage suitable for providing downloads from connected computers, could be used for storing the programming modules and ancillary software components. It would be known to a person skilled in the art that any storage medium could be used for storing these software components so long as the storage medium can be read by a computer system.

One or more embodiments of the invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

One or more embodiments of the invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While one or more embodiments of the present invention have been described, it will be appreciated that those skilled in the art upon reading the specification and studying the drawings will realize various alterations, additions, permutations and equivalents thereof. It is therefore intended that embodiments of the present invention include all such alterations, additions, permutations, and equivalents as fall within the true spirit and scope of the invention as defined in the following claims. Thus, the scope of the invention should be defined by the claims, including the full scope of equivalents thereof.

What is claimed is:

1. An apparatus for generating a device response template at a testing device relative to a device under test (DUT) communicatively linked thereto, comprising:
a data processor configured with an instruction set to generate a device response template and to perform subsequent testing of the device under test in accordance with the device response template;
a network interface, responsive to the data processor to send a command to the DUT from the testing device;
a graphical user interface, responsive to the data processor to present a command response received from the DUT in response to the command, the command response including a plurality of parameters, the graphical user interface presenting the command response and including a menu to identify a pattern which the plurality of parameters, the menu configured to define a pattern type and to designate with portions of the identified pattern as predetermined parameters;
wherein the data processor receives pattern type assignments and designated sub-portions, and creates an electronic memory of the testing device, a device response template including a location of the pattern and location of the designated sub-portions, within the plurality of parameters, for subsequent device testing.

2. The apparatus as recited in claim 1, wherein the graphical user interface is further configured to select a sub-region in the pattern, create a variable corresponding to the sub-region, associating a data type to the variable, and storing the variable into the device response template.

3. The apparatus as recited in claim 1, wherein the pattern is a table area.

4. The apparatus recited in claim 3, further comprising a data query interface, responsive to the data processor and configured to identify a value of a table variable of the table area in accordance with a further table variable of a same row.

5. The apparatus as recited in claim 1, wherein the pattern is at least one of a free format, a marker, a prompt line, or a line table.

6. The apparatus as recited in claim 1, wherein the pattern is binary data represented by two hexadecimal characters per byte.

7. The apparatus recited in claim 1, wherein the pattern is in structured text format.

8. The apparatus in claim 1, subsequent device testing further comprises:
retrieving a device response template for said DUT from an electronic data storage operably linked to the testing device, the device response template including a location of a pattern of parameters within a plurality of parameters, the pattern including information defining dimensions of the pattern;
executing the a first testing scenario in accordance with the device response template;
receiving a device response from the DUT;
parsing the device response using device response template, the parsing including capturing parameters within the dimensions of the pattern; and
identifying variable values in correspondence to the captured parameters through parsing.

9. The apparatus in claim 8, subsequent device testing further comprising:
executing a second testing scenario for the DUT;
providing the variable values of the first testing scenario to the second test scenario, the second test scenario being implemented by reading a second device response template including a location of a further pattern of parameters within a plurality of parameters, the further pattern including information defining dimensions of the further pattern;
providing the variable values from first testing scenario to the second device response template;
executing the second testing scenario in accordance with the second device response template;
receiving a second device response at the testing device from the DUT;
parsing the second device response using the second device response template, the parsing including capturing parameters within the dimensions of the further pattern, and identifying variable values in correspondence to the captured parameters through parsing.

10. The apparatus in claim 9, wherein the first testing scenario and the second testing scenario being a part of a device test suite.

11. A computer implemented method for patternizing a device response of a device, the method comprising:
sending a command to the device;
receiving the device response from the device, the device response including a plurality of parameters;
defining a parameter pattern within the plurality of parameters in the device response; and
assigning a type to the parameter pattern.

12. The computer implemented method as recited in claim 11, further including creating, in an electronic memory of the testing device, a device response template including a location of the parameter pattern within the plurality of parameters.

13. The computer implemented method as recited in claim 11, wherein the defining of the parameter pattern including:
selecting a sub-region in the parameter pattern;
creating a variable corresponding the sub-region; and
associating a data type to the variable.

14. The computer implemented method as recited in claim 11, wherein the parameter pattern is at least one of a table area, a free format, a marker, a prompt line, a line table.

15. A computer readable media having programming instructions for patternizing a device response of a device, the computer readable media comprising:
programming instructions for sending a command to the device;
programming instructions for receiving the device response from the device, the device response including a plurality of parameters;
programming instructions for defining a parameter pattern within the plurality of parameters in the device response; and
programming instructions for assigning a type to the parameter pattern.

16. The computer readable media as recited in claim 15, further including programming instructions for creating, in an electronic memory of the testing device, a device response template including a location of the parameter pattern within the plurality of parameters.

17. The computer readable media as recited in claim 15, wherein the programming instructions for defining of the parameter pattern including:
programming instructions for selecting a sub-region in the parameter pattern;
programming instructions for creating a variable corresponding the sub-region; and
programming instructions for associating a data type to the variable.

18. The computer readable media as recited in claim 15, wherein the parameter pattern is at least one of a table area, a free format, a marker, a prompt line, a line table.

* * * * *